United States Patent
Fukuhara

(10) Patent No.: US 6,968,027 B2
(45) Date of Patent: Nov. 22, 2005

(54) DIGITAL PLL DEVICE AND DIGITAL PBX USING THE SAME

(75) Inventor: Yoshikazu Fukuhara, Onojo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 825 days.

(21) Appl. No.: 09/875,255

(22) Filed: Jun. 7, 2001

(65) Prior Publication Data

US 2002/0027966 A1    Mar. 7, 2002

(30) Foreign Application Priority Data

Jun. 9, 2000    (JP) ............................. 2000-173162

(51) Int. Cl.⁷ ............................................. H03D 3/24
(52) U.S. Cl. ...................... 375/376; 375/294; 327/156
(58) Field of Search ............................. 375/354, 371, 375/373–376, 286, 293, 294; 327/156, 155, 327/141, 100

(56) References Cited

U.S. PATENT DOCUMENTS 5,572,167 A * 11/1996 Alder et al. .................... 331/2
5,673,004 A * 9/1997 Park ............................. 331/1 A
5,883,533 A * 3/1999 Matsuda et al. ............. 327/156

FOREIGN PATENT DOCUMENTS

JP    07-326963    12/1995

* cited by examiner

*Primary Examiner*—Kevin Burd
(74) *Attorney, Agent, or Firm*—McDermott Will & Emery LLP

(57) ABSTRACT

A digital PLL device in accordance with the present invention comprises a selector for selecting one of a first synchronous timing signal and a second synchronous timing signal, and a comparator for outputting a phase correction value corresponding to phase difference between the synchronous timing signal selected by the selector and an internal synchronous timing signal. The digital PLL device stores the phase correction value from the comparator at a stable operation. The digital PLL device also performs a hold over operation accompanied by high accurate phase correction based on the phase correction value, since a fault occurs in the first synchronous timing signal until the timing signal is switched to the second synchronous timing signal.

4 Claims, 10 Drawing Sheets

FIG. 8

| Phase detector 22 (Count value) | | Frequency detector 24 (Count value) | Phase-correction-value Detector 25 | Supplemental remarks | Determination |
|---|---|---|---|---|---|
| A (2048~3413) | | — | Minus correction | No-correction during forward protection state | Asynchronous |
| B | B− (3414~4094) | ≥16384 | non correction | | Synchronous |
| | | =16383 | Minus correction | | |
| | | ≤16382 | Minus correction | | |
| | B0 (4095) | ≥16384 | Plus correction | | |
| | | =16383 | non correction | | |
| | | ≤16382 | Minus correction | | |
| | B+ (0~681) | ≥16384 | Plus correction | | |
| | | =16383 | Plus correction | | |
| | | ≤16382 | non correction | | |
| C (682~2047) | | — | Plus correction | No-correction during forward protection state | Asynchronous |

DIGITAL PLL DEVICE AND DIGITAL PBX USING THE SAME

FIELD OF THE INVENTION

The present invention relates to a digital Phase Locked Loop (PLL) device capable of suppressing frequency fluctuation of an output clock signal caused by occurrence of a fault, and a digital private branch exchange (PBX).

BACKGROUND OF THE INVENTION

A digital PLL device as shown in FIG. 10 is conventionally used for certainly obtaining a clock signal with high reliability over a digital synchronous network. The conventional digital PLL device comprises selector 1, phase comparator 2, digital voltage control oscillator (D-VCO) 5, loop filter 6, and controller 7.

In a digital PBX, for example, a digital PLL device for generating a timing signal is installed in a main card as a primary master and the other input/output (I/O) (secondary master) cards. This digital PLL device receives first synchronous timing signal "a" from the primary master, and receives second synchronous timing signal "b" from the other I/O card when it cannot normally receive first synchronous timing signal "a". Selector 1 selects any synchronous timing signal and sends it as synchronous timing signal "d" to phase comparator 2.

Phase comparator 2 compares a phase of synchronous timing signal "d" with that of internal timing signal "c" generated by dividing a clock signal created by the D-VCO with a loop filter. Phase comparator 2 sends a signal corresponding to the phase difference, namely phase correction signal "e", to D-VCO 5. D-VCO 5 generates a clock signal with a frequency corresponding to the phase difference. Specifically, D-VCO 5 decreases the frequency when the phase of the internal timing signal has advanced, and increases the frequency when the phase has delayed. Loop filter 6 divides the clock signal sent from D-VCO 5 by N, and outputs an internal timing signal.

Phase comparator 2, D-VCO 5, and loop filter 6 configure a digital PLL circuit.

Each I/O card normally creates clock signal "f" at the loop filter 6. Clock signal "f" synchronizes with first synchronous timing signal "a" transmitted from the main card (primary master). Clock signal "f" is supplied to a required circuit in the device through an output terminal.

When first synchronous timing signal "a" to be received is interrupted, controller 7 detects the interruption of first synchronous timing signal "a", and switches the signal to second synchronous timing signal "b". Until first synchronous timing signal "a" is recovered, clock signal "f" synchronizing with second synchronous timing signal "b" is created.

When conventional digital PLL device changes over the first synchronous timing signal to the second synchronous timing signal for protecting against fault occurrence in the first synchronous timing signal, synchronous timing signal "d" to be fed into phase comparator 2 momentarily interrupts. The momentary interruption causes frequency fluctuation of clock signal "f".

SUMMARY OF THE INVENTION

The present invention addresses the problems discussed above. A digital PLL device in accordance with the present invention comprises the following elements:

(1) a first selector for selecting and outputting one of a first synchronous timing signal and a second synchronous timing signal;

(2) a comparing means for comparing a phase of the synchronous timing signal selected by the first selector with that of an internal synchronous timing signal, and outputting phase correction data corresponding to the phase difference;

(3) a hold over control means for outputting hold over data for performing phase correction;

(4) a second selector for selecting one of the phase correction data supplied from the comparing means and the hold over data supplied from the hold over control means;

(5) a digital VCO for creating a clock signal with a frequency corresponding to data supplied from the second selector; and (6) a means for creating the internal synchronous timing signal from the clock signal created from the digital VCO. When a hold over mode is set, the second selector selects the output from the hold over control means.

A digital PBX in accordance with the present invention comprises the following elements:

(1) a plurality of I/O cards corresponding to various internal and external interfaces;

(2) a main card for controlling the I/O cards; and (3) a back board for performing data communications between the main card and each I/O card and between the plurality of I/O cards, and voice data communication through time slots in a plurality of channels. Each the main card and a card serving as a master among I/O cards includes the digital PLL device in accordance with the present invention.

BRIEF DESCRIPTION OF THE DRAWINGS

FIG. 8 is a reference table for synchronous/asynchronous determination for the phase comparator in accordance with the fourth exemplary embodiment.

DESCRIPTION OF THE PREFERRED EMBODIMENTS

Exemplary embodiments of the present invention will be described hereinafter with reference to FIG. 1 through FIG. 9.

(Embodiment 1)

Figure 1:
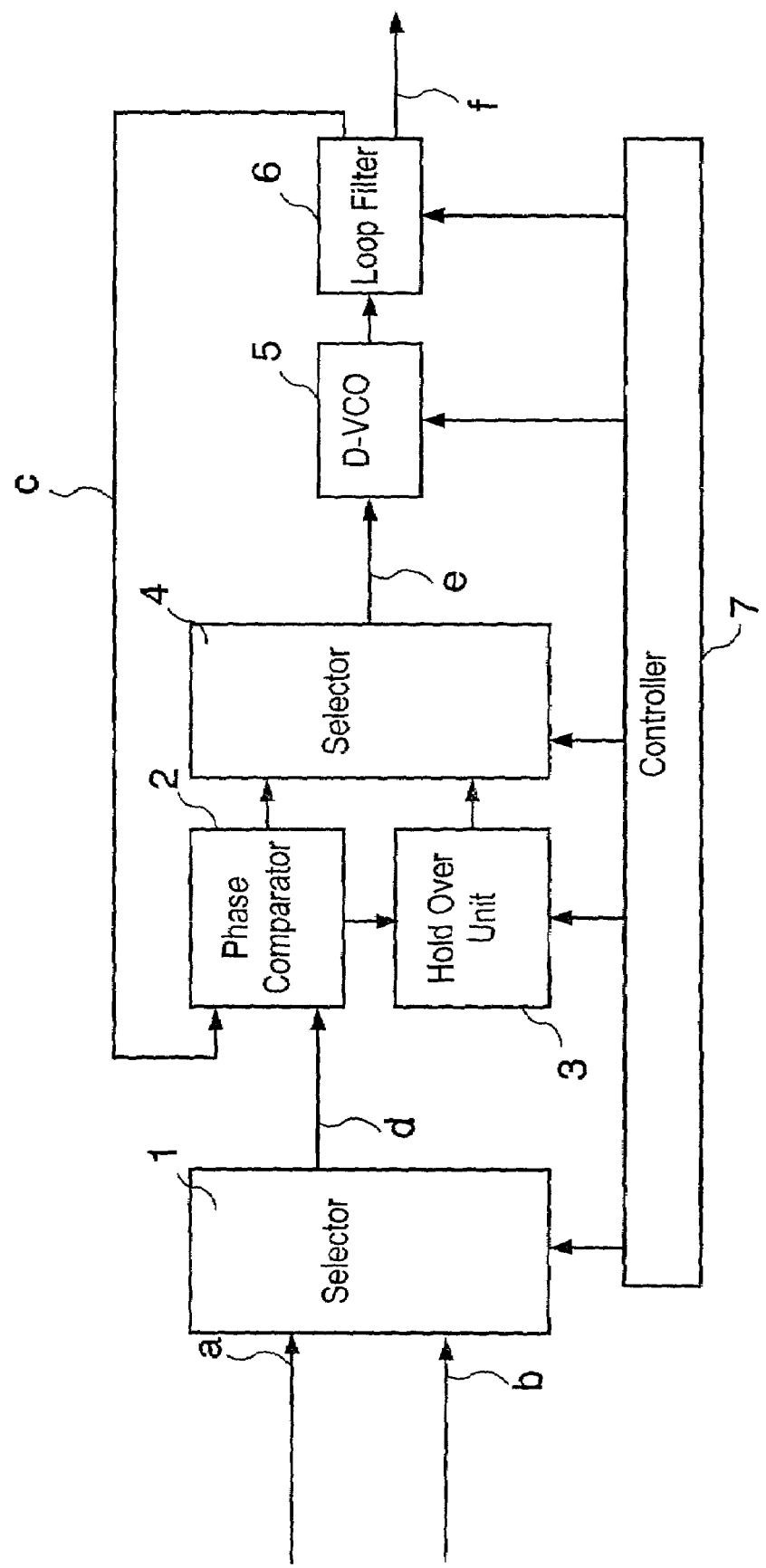
FIG. 1 is a block diagram of a digital PLL device in accordance with a first exemplary embodiment of the present invention.

FIG. 1 is a block diagram of a digital PLL device in accordance with exemplary embodiment 1 of the present invention. In FIG. 1, first selector 1 changes over first synchronous timing signal "a" to second synchronous timing signal "b" if changing synchronous timing over a digital synchronous network. Phase comparator 2 compares a phase of synchronous timing signal "d" supplied from first selector 1 with that of internal timing signal "c", and outputs a phase correction value corresponding to the phase difference. Hold over unit 3 accurately corrects the phase until the synchronous timing signals change over. In other words, hold over unit 3 stores the phase correction value from phase comparator (hereinafter called PC) 2 during a stable operation, and performs a hold over operation since fault occurrence of first synchronous timing signal "a" until changing over to second synchronous timing signal "b".

Second selector 4 selects and outputs phase correction value data from PC 2 in a normal state, and phase correction value data from hold over unit 3 in a hold over mode. Digital VCO (hereinafter called D-VCO) 5 outputs a clock signal with a frequency corresponding to output signal "e" from second selector 4. Loop filter 6 outputs synchronous timing signal "c" with a frequency at which unwanted harmonic and noise are removed from the clock signal supplied from D-VCO 5. Controller 7 controls all blocks.

An operation of the digital PLL device with the configuration discussed above is described. For certainly obtaining a clock signal with high reliability over the digital synchronous network, first synchronous timing signal "a" and second synchronous timing signal "b" are respectively transmitted from a primary master and a secondary master. When first synchronous timing signal "a" is normal, first selector 1 selects first synchronous timing signal "a" and sends it to PC 2. PC 2 compares phases between synchronous timing signal "d" (here, same as first synchronous timing signal "a") supplied from first selector 1 and internal timing signal "c", and sends a signal corresponding to the phase difference to D-VCO 5 through second selector 4. Internal timing signal "c" is generated at loop filter 6 by dividing a clock signal created by D-VCO 5.

D-VCO 5 decreases frequency of the output clock when the phase of the internal timing signal has advanced due to the signal "e" sent from PC 2, and increases the frequency when the phase has delayed. Loop filter 6 divides the output clock signal from D-VCO 5 by N to create internal timing signal "c". Loop filter 6 also removes unwanted harmonic and noise from the clock signal supplied from D-VCO 5, The primary master is, for example, the main card in a digital PBX. When the digital PLL device in accordance with embodiment 1 is installed in this main card and the other I/O cards, each I/O card normally receives a timing signal from the main card as first synchronous timing signal "a", and creates a timing signal synchronizing with it. In other words, in each I/O card, loop filter 6 creates a clock signal synchronizing with the synchronous timing signal sent from the master, and supplies it through an output terminal to a required circuit in the card. A synchronous timing signal comprises a clock signal and a frame signal.

When the main card fails and first synchronous timing signal "a" cannot be normally received, a certain I/O card serves as the master. Each I/O card performs changing over to synchronous timing signal "b" transmitted from the I/O card serving as the master. In this case, a hold over operation is performed until the completion of the changeover process.

Hold over unit 3 stores a phase correction value of PC 2 at a stable operation in hold over unit 3. When a fault occurs in first synchronous timing signal "a" transmitted from the primary master, selector 4 selects an output from hold over unit 3 under control by controller 7 since fault occurrence until the changing over to synchronous timing signal "b". Hold over unit 3 performs highly accurate phase correction by using the phase correction value stored at the stable operation to.

After a predetermined period, the hold over operation is finished, and a synchronous timing signal synchronizing with synchronous timing signal "b" is created.

As discussed above, when a fault occurs in the first synchronous timing signal and the first synchronous timing signal is changed over to the second synchronous timing signal, the hold over operation is performed by using a hold over circuit. A phase difference between the second synchronous timing signal and the internal timing signal sent from the loop filter can be therefore decreased. Fluctuation of clock signal "f" created by loop filter 6 can be suppressed.

(Embodiment 2)

Figure 2:
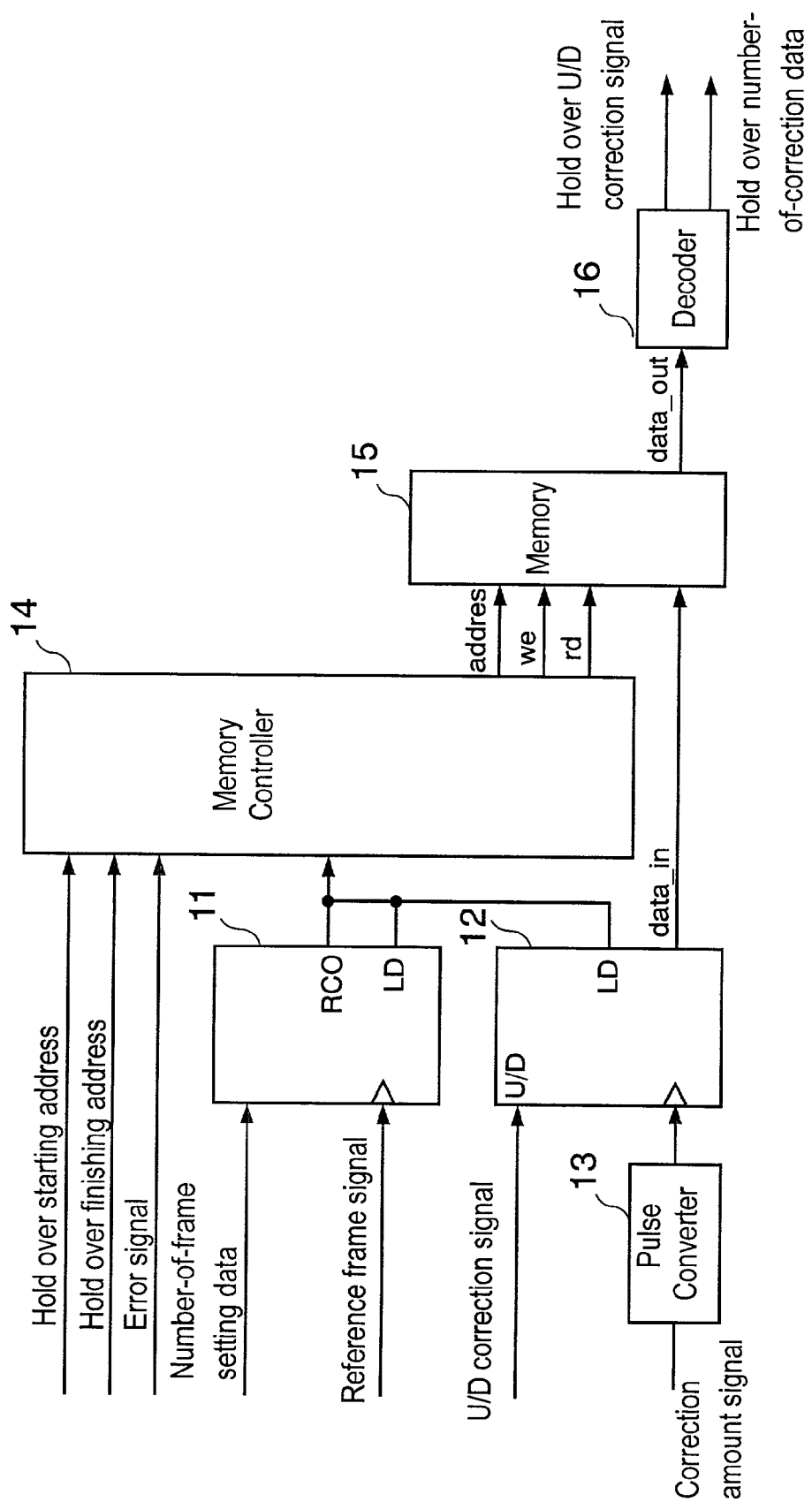
FIG. 2 is a block diagram of a hold over unit of a digital PLL device in accordance with a second exemplary embodiment of the present invention.
Figure 3:
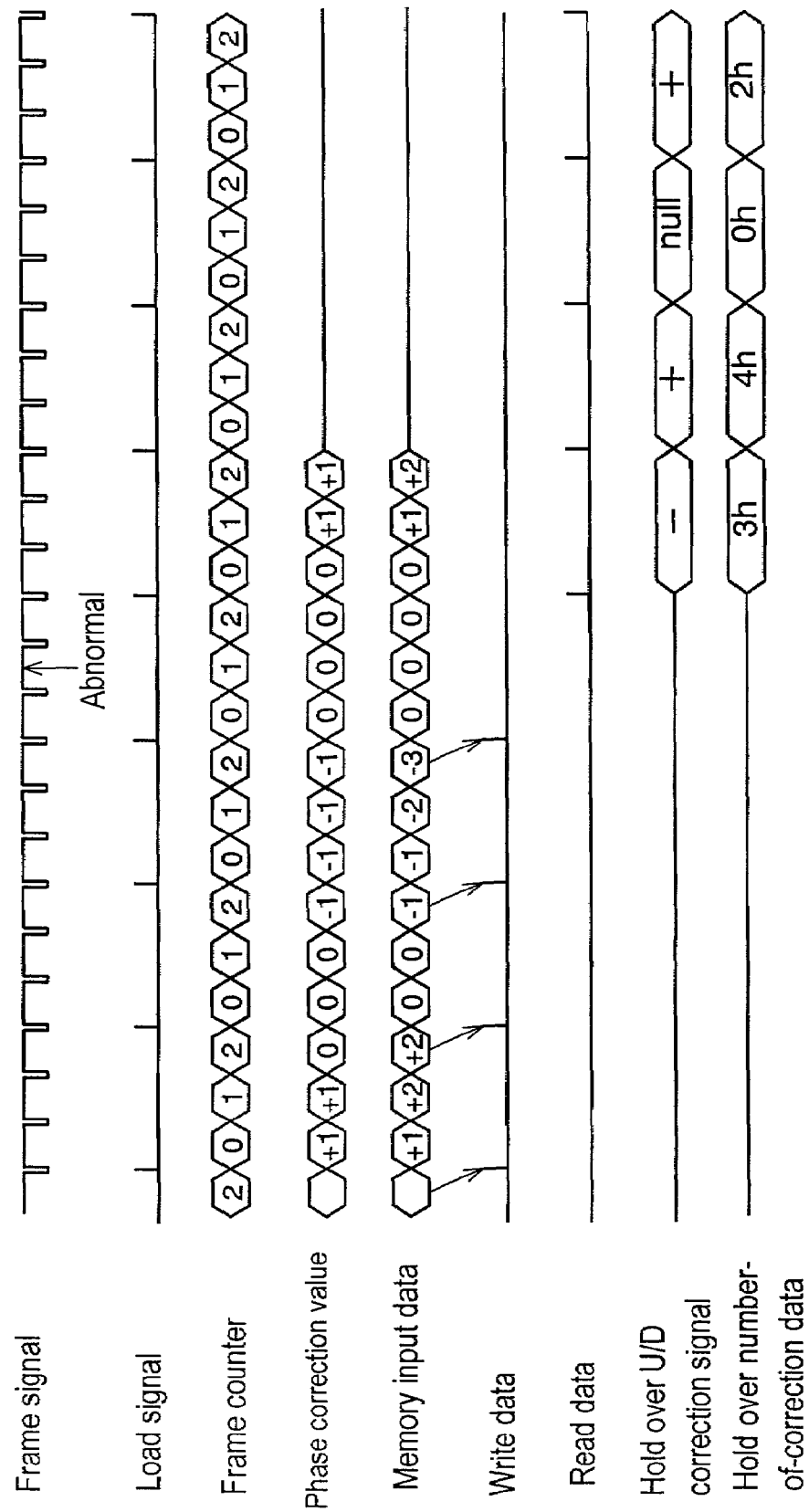
FIG. 3 is a timing chart showing operation of the hold over unit of the digital PLL device in accordance with the second exemplary embodiment.

A specific example of a digital PLL device in accordance with the present invention will be described hereinafter. FIG. 2 is a block diagram of a hold over unit of the digital PLL device, and FIG. 3 is a timing chart showing an operation of the hold over unit. An operation of the hold over unit will be described hereinafter.

Hold over unit 3 of the digital PLL device comprises frame counter 11, pulse converter 13, up/down counter 12, memory controller 14, memory 15, and decoder 16, as shown in FIG. 2. An operation of a circuit with such a structure is described.

Controller 7 sets number-of-frame setting data on frame counter 11. The setting data is used for determining every how many frames correction value data is stored on memory 15. In this embodiment, the data is stored on the memory every three frames.

A U/D correction signal from phase comparator 2 controls the addition and subtraction of up/down counter 12. When phase correction value is zero, the addition and subtraction are prohibited.

A correction amount signal representing number of corrections every frame is fed from phase comparator 2 into pulse converter 13. Pulse converter 13 converts the signal to pulses counted by the up/down counter. Up/down counter 12 counts number of pulses corresponding to the number of corrections.

Up/down counter 12 counts the pulses every K frames (K=3, in this embodiment).

The count data by up/down counter 12 is stored as memory input data on memory 15 every three frames. Memory 15 has a ring buffer structure. When a limited capacity from a start address is full, overwriting is started from the start address. This operation is repeated.

When an abnormality occurs in a synchronous timing signal, memory controller 14 detects an error signal from controller 7, stops data writing on memory 15, and changes over to a read operation. In this read operation, data is read every three frames set by frame counter 11. Decoder circuit 16 decodes the data read from memory 15, and outputs a hold over U/D correction signal and hold over number-of-correction data (FIG. 3).

A D-VCO outputs a clock signal corresponding to the hold over U/D correction signal and the hold over number-of-correction data in a hold over mode.

The number of frames is set as a storing period of correction value data on frame counter 11 as discussed above. By utilizing the periodicity of the phase correction amount, it can be set and control every how many frames the phase correction amount is written and stored on memory 15. Memory capacity can be therefore reduced while keeping a phase correction accuracy.

(Embodiment 3)

Figure 4:
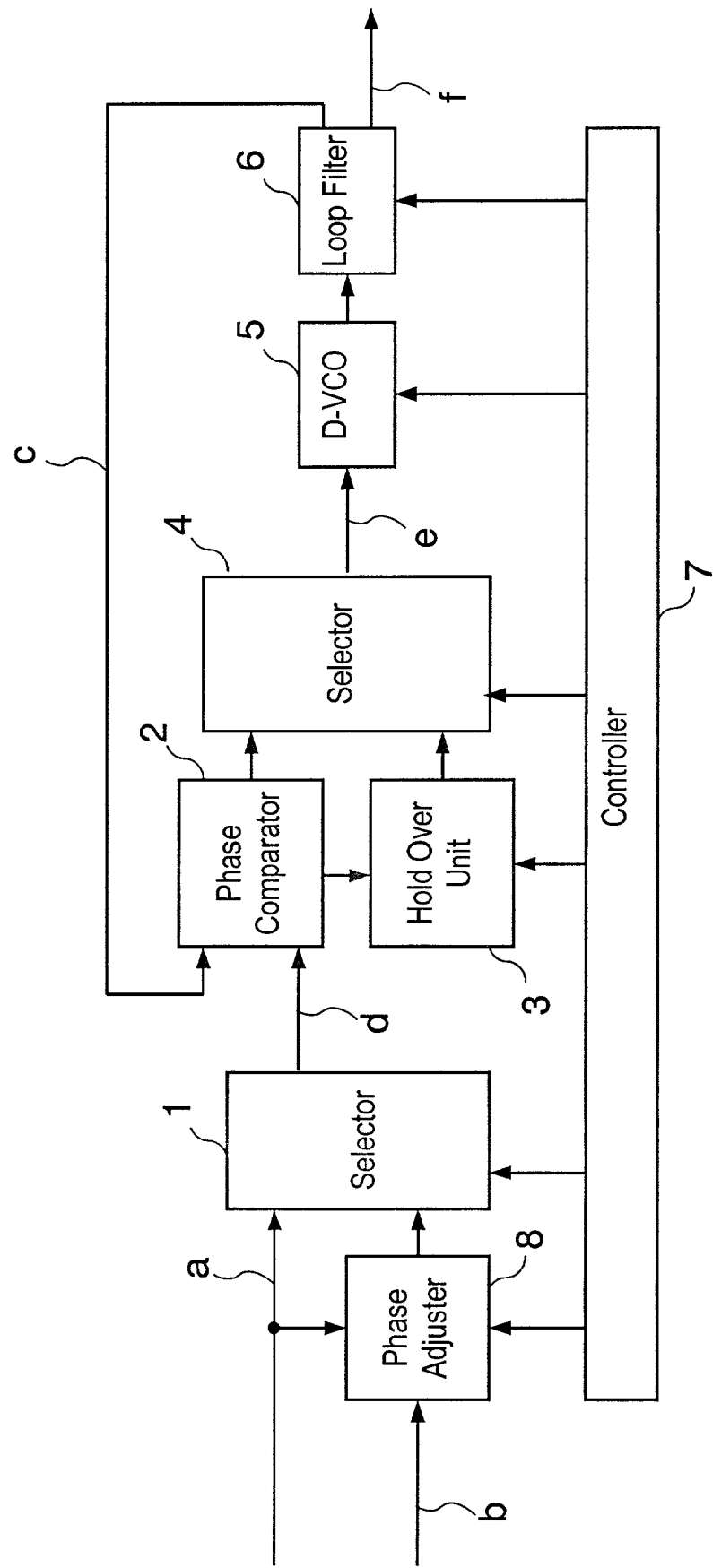
FIG. 4 is a block diagram of a digital PLL device in accordance with a third exemplary embodiment of the present invention.

FIG. 4 is a block diagram of a digital PLL device in accordance with a third exemplary embodiment of the present invention. The configuration thereof is same as that of the digital PLL device in accordance with exemplary embodiment 1 except for phase adjuster 8, and therefore is not described.

An operation thereof is described. When a fault occurs in first synchronous timing signal "a", first synchronous timing signal "a" is changed over to second synchronous timing signal "b". In that case, phase adjuster 8 previously brings second synchronous timing signal "b" into edge synchronization with first synchronous timing signal "a". Phase adjuster 8 detects a stable operation of first synchronous timing signal "a" based on a status signal from controller 7, and periodically provides the edge synchronization during the stable operation. The edge synchronization can be realized, for example, by delaying the second synchronous timing signal so that a phase of the first synchronous timing signal matches with that of the second synchronous timing signal.

When a fault occurs in the first synchronous timing signal, the synchronous timing can be changed over without phase difference.

(Embodiment 4)

Figure 5:
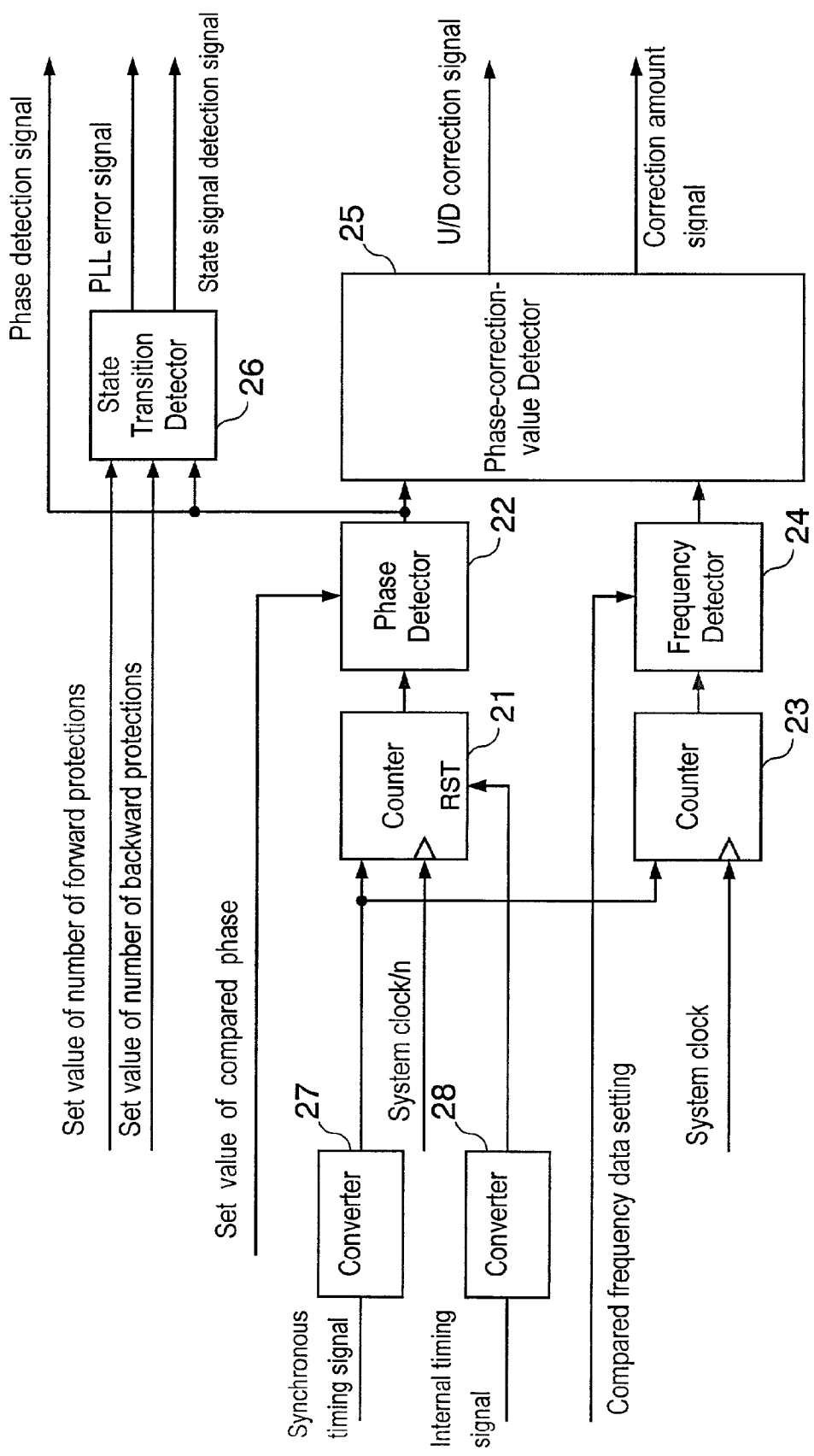
FIG. 5 is a block diagram of a phase comparator of a digital PLL device in accordance with a fourth exemplary embodiment of the present invention.
Figure 6:
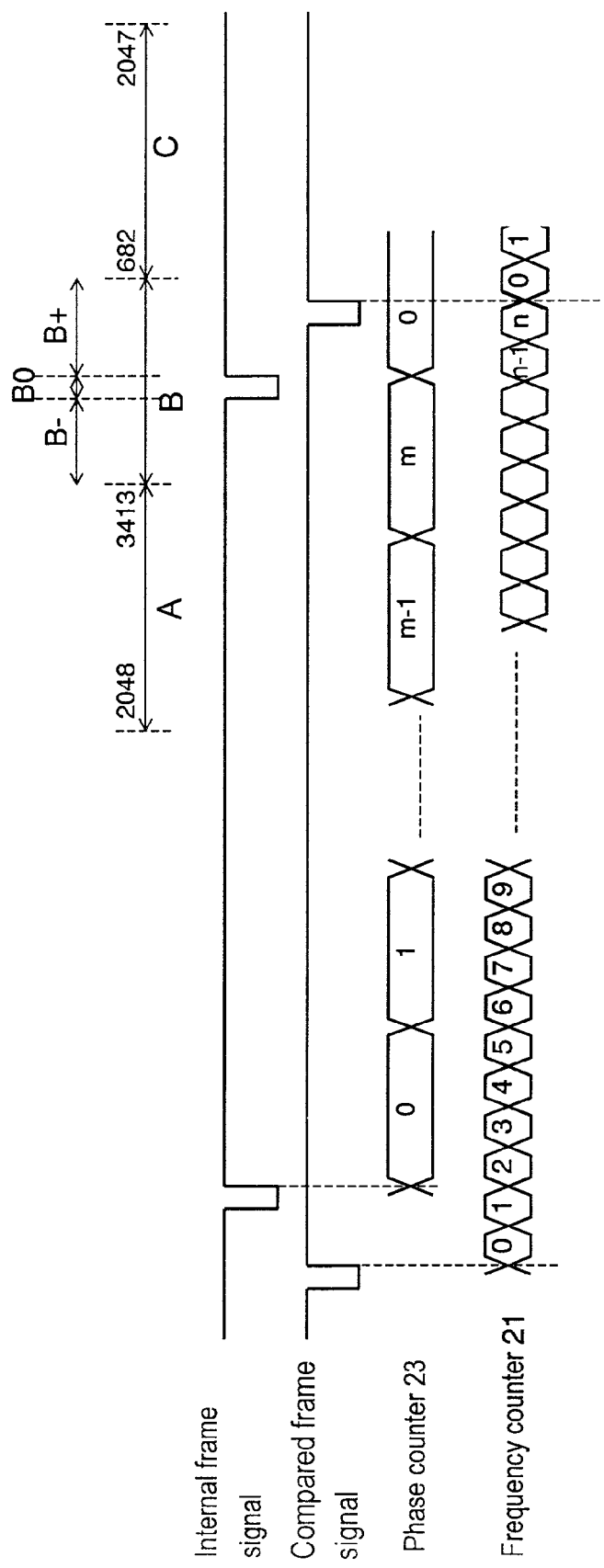
FIG. 6 is a timing chart showing operation of the phase comparator of the digital PLL device in accordance with the fourth exemplary embodiment.
Figure 7:
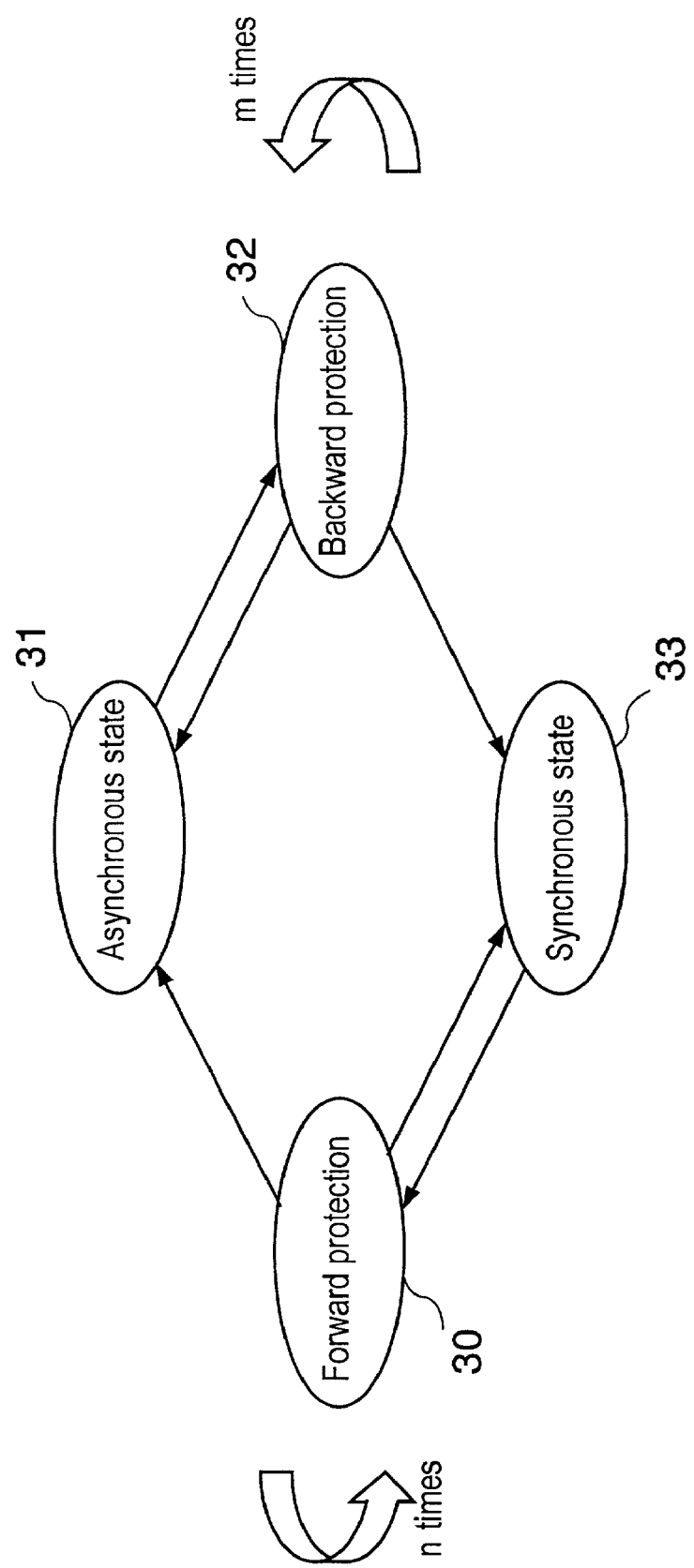
FIG. 7 is a state transition diagram of the phase comparator in accordance with the fourth exemplary embodiment.

A specific example of a phase comparator of a digital PLL device in accordance with exemplary embodiment 4 of the present invention will be described hereinafter. FIG. 5 is a block diagram of the phase comparator, FIG. 6 is a timing chart showing operation of the phase comparator, and FIG. 7 is a state transition diagram of the phase comparator. FIG. 8 is a reference table for synchronous/asynchronous determination for the phase comparator.

Phase comparator 2 in the digital PLL device in FIG. 5 comprises phase counter 21, phase detector 22, frequency counter 23, frequency detector 24, phase-correction-value detector 25, and state transition detector 26.

Converter 28 creates a frame signal from an internal timing signal, and outputs it as an internal frame signal. Converter 27 creates a frame signal from incoming synchronous timing signal "d", and outputs it as a compared frame signal.

Phase counter 21 and phase detector 22 detect phase difference between the internal frame signal created from the internal timing signal and the compared frame signal created from synchronous timing signal "d". Phase counter 21 is reset on the rising edge of the internal frame signal, and counts clock pulses provided by dividing a system clock by n. The count value is latched on the rising edge of the compared frame signal (FIG. 6). A synchronous/asynchronous state is detected by comparing the count value with compared phase data preset in phase detector 22 including a comparator. One of three phase states, namely advance (B−), delay (B+), or match (B0) is detected in the synchronous state (FIG. 8).

Besides the phase condition, a frequency condition is detected for improving phase correction accuracy. Frequency counter 23 counts periods of compared frame signal with a system clock. Frequency detector 24 detects one of three states, namely low, high, or match in relation to an ideal frequency based on the count value.

Based on the state detection result by phase detector 22 and frequency detector 24, phase-correction-value detector 25 performs determination among three alternatives, namely negative correction, positive correction, and non correction, every frame, and outputs the result as a U/D) correction signal (FIG. 8). If period Tc of the internal frame signal is longer than period Td of the compared frame signal, negative correction is determined. If period Tc is shorter than period Td, positive correction is determined. The phase determination operation is performed every frame, and the phase correction is performed at its next frame.

Referring to FIG. 7, a state transition diagram of the phase comparator is hereinafter described. State transition detector 26 informs controller 7 of a synchronous state on the basis of the synchronous/asynchronous determination result from phase detector 22. State transition detector 26 detects the state as shown in FIG. 7. When synchronousness is detected one time in an asynchronous state, the state changes to a backward protection state. When synchronousness is continuously detected m times in the backward protection state, the state changes to the synchronous state. When asynchronousness is detected even one time, however, the state changes to the asynchronous state. When asynchronousness is detected one time in the synchronous state, the state changes to a forward protection state. When asynchronousness is continuously detected n times in the forward protection state, the state changes to the asynchronous state. When synchronousness is detected even one time, however, the state changes to the synchronous state.

When state transition is made from synchronousness to asynchronousness (namely, the forward protection state changes to the asynchronous state), controller 7 is informed of a PLL error signal. A phase detection signal from phase detector 22 is supplied to controller 7. When the phase state is detected, a correction amount is automatically varied responsive to the phase state, and the phase is tracked.

Synchronousness or asynchronousness is automatically determined based on the phase condition of synchronous timing signal "d" and conditions of the forward protection and the backward protection. The phase correction accuracy is improved using these phase conditions and the frequency condition.

A synchronous state of PLL can be detected in detail and the phase correction accuracy is improved in embodiment 4.

(Embodiment 5)

The phase comparator shown in FIG. 5 except for phase-correction-value detector 25 is same as that in the digital PLL device in accordance with embodiment 4, and therefore is not described. An operation of phase-correction-value detector 25 is described.

Phase comparator 2 of the digital PLL device determines synchronousness or asynchronousness based on an output signal from phase detector 22 of synchronous timing signal "d". When phase comparator 2 determines the asynchronousness, it increases an amount of phase correction performed in one frame period on the basis of setting by controller 7. When phase comparator 2 determines the synchronousness, it decreases the phase correction amount in one frame period on the basis of setting by controller 7. As a result, phase track speed can be automatically varied responsive to a phase shift.

Phase-correction-value detector 25 in embodiment 5 automatically changes the phase tracking speed responsive to the phase difference based on a correction amount signal. A phase can be corrected more speedily and accurately compared with fixed correction.

(Embodiment 6)

Figure 9:
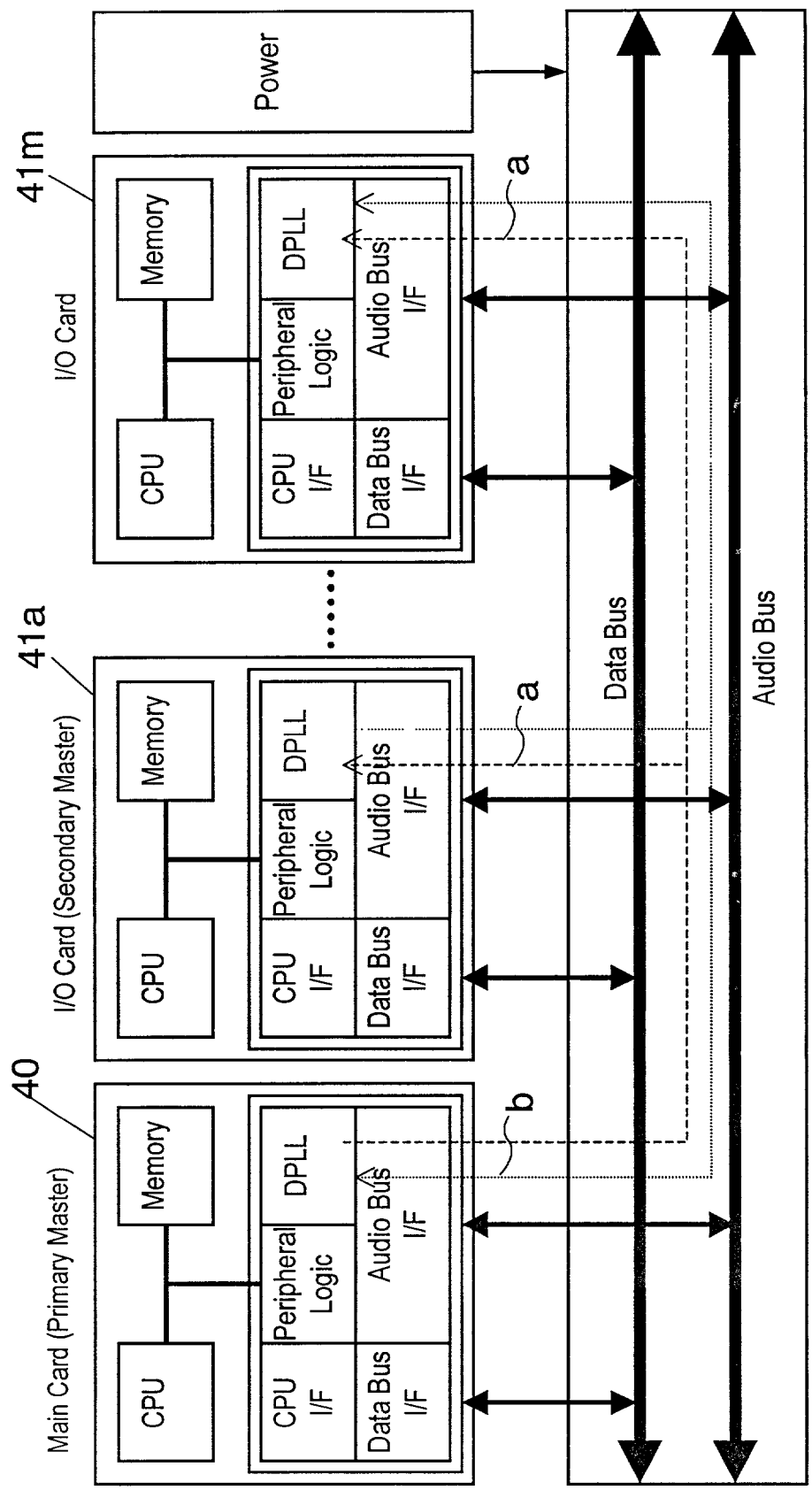
FIG. 9 is a block diagram of a digital PBX including the digital PLL device in accordance with the present invention.
Figure 10:
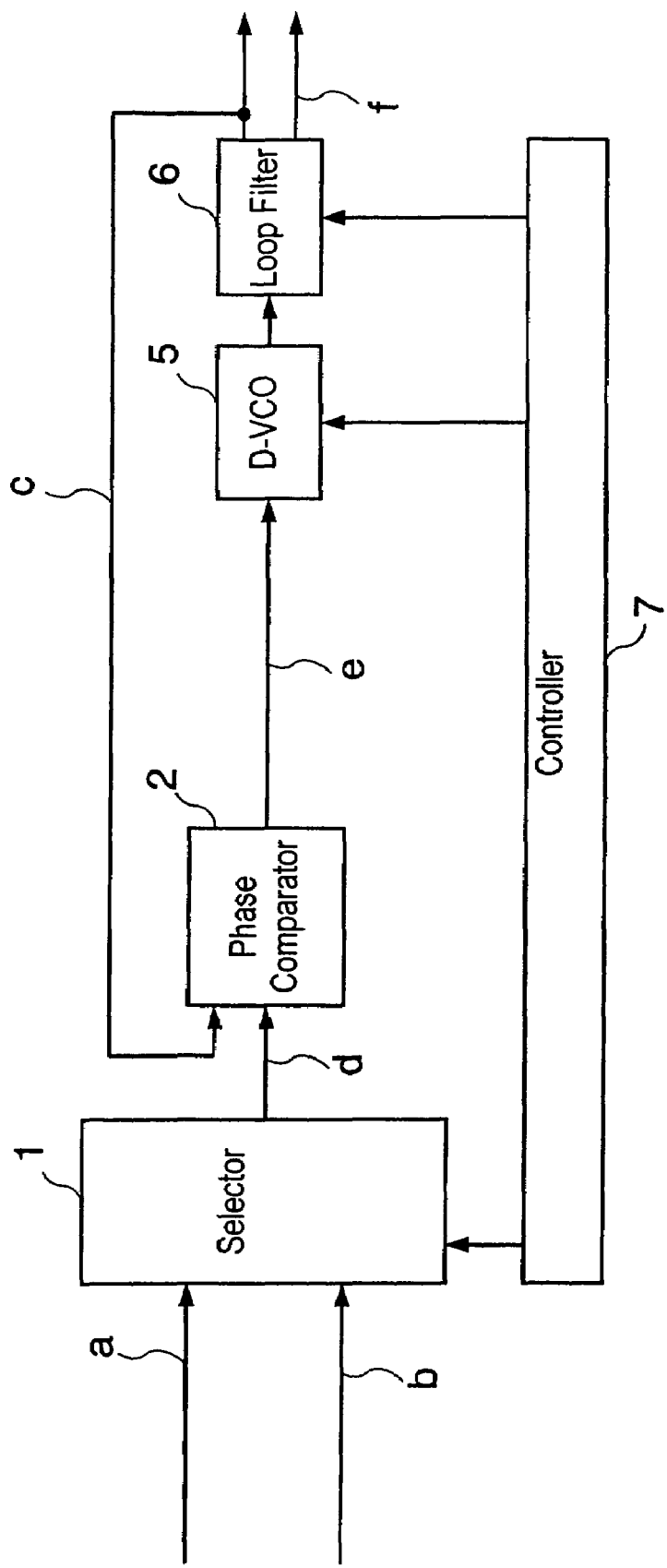
FIG. 10 is a block diagram of a conventional digital PLL device.

Referring to FIG. 9, there is shown a configuration of a digital PBX including the digital PLL device in accordance with the present invention. The digital PBX comprises main card 40 for controlling all cards, a plurality of I/O cards 41 corresponding to various internal and external interfaces, back board 42 for performing data communication between cards and voice data communication through time slots in a plurality of channels, and power supply 43. Only main card 40 and I/O card 41a as a digital trunk card can function as a clock master card. I/O card 41m cannot function as the clock master card. Main card 40 functions as a primary master by default.

A DPLL (digital PLL) device in main card 40 comprises a Master PLL circuit and a Slave PLL circuit, operates as a Master PLL for a clock signal from a digital network, and creates a 8 MHz clock signal and a 8 MHz frame signal. The clock signal and frame signal are supplied to an audio bus of backboard 42 and an internal interface.

I/O card 41a as a secondary master also comprises a Master PLL circuit and a Slave PLL circuit, and performs a Master PLL operation for a clock signal from a digital network. I/O card 41a supplies, as a standby clock signal, a 8 MHz clock signal and a 8 MHz frame signal to the audio bus interface of the backboard. These signals are synchronizing with the 8 KHz signals from the primary master (main card 40). I/O card 41a also performs a Slave PLL operation for the 8 MHz clock signal and the 8 MHz frame signal from the primary master, and outputs a created signal to the internal interface.

I/O card 41m that cannot function as the master comprises a Slave PLL circuit, performs a Slave PLL operation for the 8 MHz clock signal and the 8 MHz frame input signal from the primary master, and outputs a created signal to the internal interface.

When a clock fault is generated by output circuit break, temporary frequency fluctuation is suppressed in the hold over process, and the synchronous timing signal is changed over from the primary master to the secondary master.

What is claimed is:

1. A digital PLL device comprising:
   a first selector for selecting and outputting one of a first synchronous timing signal and a second synchronous timing signal;
   a comparator for detecting a phase difference between the synchronous timing signal selected by said first selector and an internal synchronous timing signal, and outputting phase correction data corresponding to the phase difference;
   a hold over unit for outputting hold over data used for performing phase correction;
   a second selector for selecting and outputting one of the phase correction data supplied from said comparator and the hold over data supplied from said hold over unit, said second selector selecting the output from said hold over unit when a hold over mode is set;
   a digital VCO for creating a clock signal with a frequency corresponding to data supplied from the second selector;
   a filter for creating an internal synchronous timing signal from the clock signal created by said digital VCO; and
   a controller for controlling said selectors and changing over the first synchronous timing signal to the second synchronous timing signal at switching of synchronous timing over a digital synchronous network, said controller setting the hold over mode during the changeover of the synchronous timing over the digital synchronous network,
   wherein the hold over unit comprises:
      an up/down counter, the addition/subtraction of said up/down counter being controlled by the phase correction data supplied from said phase comparator,
      a memory for storing, as the hold over data, a count value of said up/down counter every K (integer) frames,
      a memory controller for performing read control, write control, and address control of said memory, and
      a decoder for decoding the hold over data read from said memory to frequency of corrections and a correction value, and outputting the number of corrections and the correction value, and
   wherein said memory controller performs the read control of said memory in the hold over mode, and performs the write control of said memory when the synchronous timing signal supplied from said first selector is synchronizing with the internal timing signal.

2. The digital PLL device according to claim 1, wherein said phase comparator comprising:
   a phase counter for counting a phase difference between the internal timing signal and the synchronous timing signal;
   a phase detecting circuit for comparing a count value obtained by said phase counter with a phase reference value;
   a frequency counter for counting frequency of the synchronous timing signal;
   a frequency detecting circuit for comparing a count value obtained by said frequency counter with a frequency reference value;
   a phase-correction-value detecting circuit for outputting phase correction data based on a comparison result by said phase detecting circuit and a comparison result by the frequency detecting circuit; and
   a state transition detecting circuit for determining one of a synchronous state and an asynchronous state based on a phase condition of the synchronous timing signal and forward protection and backward protection conditions.

3. The digital PLL device according to claim 2,
   wherein said phase-correction-value detecting circuit changes a phase correction amount responsive to the synchronous state and the asynchronous state.

4. A digital PBX comprising:
   a plurality of I/O cards interfacing with various extensions and outside lines;
   a main card for controlling said plurality of I/O cards; and
   a back board for performing data communications between said main card and each of said plurality of I/O cards and between said plurality of I/O cards, and voice data communication through time slots in a plurality of channels, wherein said main card and one of said plurality of I/O cards for functioning as a master comprise a Master PLL device, said Master PLL device comprising:

a first selector for selecting and outputting one of a first synchronous timing signal and a second synchronous timing signal;

a comparator for detecting a phase difference between the synchronous timing signal selected by the first selector and an internal synchronous timing signal, and outputting phase correction data corresponding to the phase difference;

a hold over unit for outputting hold over data used for performing phase correction;

a second selector for selecting and outputting one of the phase correction data supplied from said comparator and the hold over data supplied from said hold over unit, said second selector selecting the output from the hold over unit when a hold over mode is set;

a digital VCO for creating a clock signal with a frequency corresponding to data supplied from the second selector;

a filter for creating an internal synchronous timing signal from the clock signal created by the digital VCO; and a controller for controlling said selectors and changing over the first synchronous timing signal to the second synchronous timing signal at switching of synchronous timing over a digital synchronous network, said controller setting the hold over mode during the changeover of the synchronous timing over the digital synchronous network, wherein the hold over unit comprises:

an up/down counter, the addition/subtraction of said up/down counter being controlled by the phase correction data supplied from said phase comparator, a memory for storing, as the hold over data, a count value of said up/down counter every K (integer) frames, a memory controller for performing read control, write control, and address control of said memory, and a decoder for decoding the hold over data read from said memory to frequency of corrections and a correction value, and outputting the number of corrections and the correction value, and wherein said memory controller performs the read control of said memory in the hold over mode, and performs the write control of said memory when the synchronous timing signal supplied from said first selector is synchronizing with the internal timing signal.

* * * * *